(12) United States Patent
Droegeler et al.

(10) Patent No.: US 11,215,334 B2
(45) Date of Patent: Jan. 4, 2022

(54) CARRIER BASE MODULE FOR A LIGHTING MODULE

(71) Applicant: Lumileds LLC, San Jose, CA (US)

(72) Inventors: Marc Droegeler, Aachen (DE); Andreas Stang, Reutlingen (DE); Anna Harder, Reutlingen (DE); Uwe Schubert, Reutlingen (DE)

(73) Assignees: LUMILEDS LLC, San Jose, CA (US); MARELLI AUTOMOTIVE LIGHTING REUTLINGEN (GERMANY) GMBH, Reutlingen (DE)

( * ) Notice: Subject to any disclaimer, the term of this patent is extended or adjusted under 35 U.S.C. 154(b) by 0 days.

(21) Appl. No.: 16/703,963

(22) Filed: Dec. 5, 2019

(65) Prior Publication Data

US 2020/0182426 A1 Jun. 11, 2020

(30) Foreign Application Priority Data

Dec. 5, 2018 (EP) ..................................... 18210488

(51) Int. Cl.
| | | |
|---|---|---|
| *F21S 41/19* | (2018.01) | |
| *F21V 29/70* | (2015.01) | |
| *F21S 41/143* | (2018.01) | |
| *F21S 45/48* | (2018.01) | |
| *F21Y 115/10* | (2016.01) | |

(52) U.S. Cl.
CPC ........... *F21S 41/192* (2018.01); *F21S 41/143* (2018.01); *F21S 45/48* (2018.01); *F21V 29/70* (2015.01); *F21Y 2115/10* (2016.08)

(58) Field of Classification Search
CPC ........ F21S 41/192; F21S 41/143; F21V 29/70
See application file for complete search history.

(56) References Cited

U.S. PATENT DOCUMENTS

| | | | | |
|---|---|---|---|---|
| 8,564,000 | B2 * | 10/2013 | Hussell .................. | H01L 33/62 |
| | | | | 257/98 |
| 9,190,394 | B2 * | 11/2015 | Singer ..................... | H01L 33/62 |
| 9,961,770 | B2 * | 5/2018 | Dummer ................. | B23K 1/20 |
| 10,551,011 | B2 * | 2/2020 | Bancken .................. | F21V 7/28 |
| 2011/0233565 | A1 | 9/2011 | Bierhuizen | |

(Continued)

FOREIGN PATENT DOCUMENTS

WO    2018/069231 A1    4/2018

OTHER PUBLICATIONS

Extended European Search Report dated Jun. 19, 2019 for European Patent Application No. 18210488.5.

(Continued)

*Primary Examiner* — Evan P Dzierzynski
(74) *Attorney, Agent, or Firm* — Volpe Koenig

(57) ABSTRACT

Methods, apparatus and systems are described. An apparatus includes a module body made of a polymer material. The module body includes a mounting surface adjacent a potting area. At least two lead frame elements are embedded in the polymer material of the module body. Each of the at least two lead frame elements has a first terminal side and a second terminal side in the component potting area. An LED element is on the mounting surface of the module body and electrically coupled to the first terminal side of the at least two lead frame elements.

18 Claims, 3 Drawing Sheets

(56) References Cited

U.S. PATENT DOCUMENTS

| | | | |
|---|---|---|---|
| 2012/0025217 A1* | 2/2012 | Low | H01L 25/0753 |
| | | | 257/88 |
| 2013/0334974 A1 | 12/2013 | Tamura et al. | |
| 2014/0217443 A1* | 8/2014 | Heikman | H01L 33/44 |
| | | | 257/98 |
| 2016/0029485 A1 | 1/2016 | Dummer | |
| 2016/0245474 A1* | 8/2016 | Duarte | H01L 33/647 |
| 2020/0080716 A1* | 3/2020 | Mertens | F21V 25/10 |

OTHER PUBLICATIONS

Written Opinion of the International Searching Authority dated Jun. 11, 2020 for PCT International Application No. PCT/EP2019/082133.

International Search Report dated Mar. 4, 2020 for PCT International Application No. PCT/EP2019/082133.

* cited by examiner

CARRIER BASE MODULE FOR A LIGHTING MODULE

FIELD OF INVENTION

The invention relates to a carrier base module for a lighting module, a lighting module as well as a method for producing a customizable lighting module. In particular, the invention relates to a carrier base module for a lighting module with at least one LED element for automotive lighting and/or signaling.

BACKGROUND

LED elements are regularly used for lighting applications, such as for example automotive lighting.

LED modules usually comprise at least one LED element as well as further electronic components, which are fixed within a module body of the LED module. Usually, the electronic components are first assembled and mounted to a lead frame and afterwards glued to the module body and/or embedded in the material of the module body. Accordingly, the lighting modules are self-contained, non-modifiable units which cannot be easily customized.

The reference WO 2018/069231 A1 describes a thermally self-supporting LED lighting unit comprising a heatsink and an LED module mounted onto the heatsink, wherein the LED module comprises a carrier with a number of LED dies mounted on the carrier as well as LED electrode contacts formed on the carrier. The heatsink is encased in an overmould, wherein a mounting surface region of the heatsink is exposed upon which the LED module is mounted. Finally, an electrical interface is also encased in the overmould and arranged to electrically connect the LED module with a power supply.

SUMMARY

It may be considered desirable to provide a carrier base module for a lighting module as well as a method that allows to modify the lighting module to the customer's demands or requirements.

It may be considered in particular desirable to provide a lighting module which can be easily modified during the product cycle to take tribute to the ongoing development.

Finally, it may be desirable to provide a lighting module which can be easily adapted to new specifications.

One or several of these objects may be addressed by a carrier base module for a lighting module according to claim 1, a lighting module according to claim 7 and a method according to claim 13. Dependent claims relate to preferred embodiments of the invention.

According to an aspect of the invention, a carrier base module for a lighting module, in particular for automotive lighting and/or signaling and most preferably for an automotive headlight, comprises a module body, at least two lead frame elements embedded in the polymer material of the module body, an LED element as a light source mounted on a mounting surface of the module body, wherein the mounting surface is arranged in or adjacent to a component potting area in and/or on the module body. According to the invention, at least two lead frame elements have a first terminal side arranged on the mounting surface or in the component potting area for electrically connecting the LED element and at least two second terminal sides, preferably each of one lead frame element, are arranged on the mounting surface or in the component potting area, so that at least one additional electronic component can be mounted after the mechanical assembly of the carrier base module to build the lighting module.

According to another aspect of the invention, a lighting module, in particular for automotive lighting and/or signaling and most preferably for an automotive headlight with a carrier base module according to the invention is provided, wherein at least one electronic component is mounted on the mounting surface and/or in the component potting area.

According to one aspect of the method according to the invention, a lighting module based on a standardized carrier base module can be adapted to different specifications. According to the method of claim 13 for producing a customizable lighting module for automotive lighting and/or signaling, first a module body is built from polymer material with a component potting area as well as with at least two lead frame elements embedded in the polymer material, wherein at least one terminal side for electrically connecting an LED element and a second terminal side for electrically connecting at least one electronic component are arranged on the module body, and afterwards a carrier base module is built by mounting an LED element on a mounting surface of the module body electrically connected to the terminal side of each of the at least two lead frame elements. Finally, to build a finished lighting module, at least one electronic component is mounted in the component potting area and electrically connecting the electronic component to the lead frame elements.

According to a further aspect, the invention may also relate to a method for producing a lighting module, in particular for automotive lighting and/or signaling, comprising the steps of building a module body with a mounting surface for an LED element, a component potting area on the surface of the module body for at least one electronic component as well as at least two lead frame elements arranged at the mounting surface and/or the component potting area with at least two terminal sides. After the module body and in particular a carrier base module is fully finished, at least one electronic component, such as an LED element, is mounted on the mounting surface and the electronic component is electrically connected to the lead frame elements. Finally, at least one further electronic component, such as a TVS diode, a thermal resistor or a capacitor, is mounted in the component potting area and/or to the mounting area and electrically connected to the lead frame elements or two further lead frame elements of the second terminal side adapting the lighting module to the customer's specifications.

The inventor has recognized that it is advantageous to be able to mount individual electronic components, in particular at least one electronic component additional to the LED element, to a standardized carrier base module to adapt the lighting module continuously to an ongoing development and continuous improvement. Additionally, it is advantageous to be able to easily modify a lighting module during the product cycle by mounting different electronic components to the same carrier base module to take tribute to the ongoing development, in particular of the efficiency of the LED and/or corresponding electronic circuit. For example, it may be desirable to be able to mount a circuit board for protecting, operating or driving the LED to an otherwise unmodified lighting module immediately after a version of this component has been developed having advantageous properties such as a lower current needed to drive the LED with the same flux.

Further, the inventor has realized that according to the present invention it may be possible to generate a broad variety of products by combining different light sources, in particular different or several LEDs, with one or several different further electronic components based on an existing lighting module and in particular without the necessity of any modification of the carrier base module of the lighting module.

The lighting module is an assembly provided to be installed in a vehicle, in particular for automotive lighting and/or signaling, and is preferably an LED headlamp module and more preferably an LED headlamp bulb unit. Further, the lighting module is preferably a completed and/or self-contained unit, which is most preferably installed in a vehicle lighting system as a single-part unit. Preferentially, also the lighting module is built to be a replaceable part of a lighting system.

The carrier base module is a part of the lighting module comprising the module body made of a polymer material as well as the lead frame elements and preferably also the LED element. Accordingly, the carrier base module is the base part of the lighting module to which the further parts, in particular the at least one electronic component additional to the LED element, is mounted to build the lighting module. The carrier base module advantageously is a universal and/or standardized module for different electronic components and accordingly, the manufacturing of the carrier base module may not be affected by a change of the used electronic components.

The carrier base module and in particular the module body has the function to allow a fixed arrangement of the other parts of the lighting module relative to one another and/or to provide a basis for mounting the other parts of the lighting module, in particular the at least one electronic component and/or the LED element. Accordingly, the module body comprises a mounting surface for the LED element and preferably at least one, more preferably further electronic components, wherein the mounting surface is preferably a part of the outer surface, in particular of a front face, of the lighting module. The mounting surface may have any size and shape. Preferably, the mounting surface is flat and/or adapted to the shape of the at least one LED element. There may be more than one mounting surface on a lighting module and in particular there may be one mounting surface for each LED element of the lighting module. Alternatively, more than one LED element might be arranged at one mounting surface and in particular, several LED elements might be arranged at one mounting surface in parallel or in series.

The LED element may comprise a single LED or several LEDs and/or further components. The term LED is used here to designate any type of solid state lighting element, such as light emitting diodes (LED), laser diodes, organic light emitting diodes (OLED) and the like, or a group of several identical or different solid state lighting elements. The LED element may comprise one or several packaged LEDs. A particularly preferred LED element may be a wire-bonded or ribbon-bonded LED, wherein the LED most preferably may have a plane light emitting surface. The light emitting surface may preferably be of rectangular shape. Additionally preferred, the LED element might comprise top contacts and/or contacts on the side of the LED element emitting the light.

The component potting area is an area and more preferably a volume at least partially, in particular fully in the module body for receiving at least one electronic component. Most preferably, the component potting area is formed by a recess in the surface of the module body. Preferentially, the component potting area of the carrier base module is not closed by any material of the module body. It is particularly preferred that the electronic components can be inserted and/or mounted in the component potting area without being embedded in any material, especially not in polymer material and/or metallic parts. Preferentially, the component potting area is built to be potted by potting material after the at least one electronic component has been mounted, wherein in particular all electronic components with the exception of the LED element can be fully covered by the potting material. The mounting surface might be partially or fully arranged in the component potting area.

To facilitate the ability to customize the lighting module, the further electronic components may be mechanically mounted to the module body and/or to further parts of the carrier base module. This may include any type of mounting means, such as e.g. clamping means, bayonet connection, snap-in connection etc. Accordingly, the electronic components in the component potting area might be fastened by form fit and/or force closure, however most preferably not fully or at least partial incorporation into material of the module body or another part of the lighting module. Additionally or alternatively, the electronic components may be glued to the module body and/or to further parts of the carrier base module, in particular with a thermal and/or electrically conductive adhesive. The electronic components may also be soldered or welded to the module body and/or to further parts of the carrier base module, in particular the terminal sides of the lead frame elements.

To be able to insert and mount an electronic component in the component potting area of the carrier base module, the component potting area may have at least one, preferably precisely one potting area opening. The potting area opening may be arranged at any position of the component potting area. However, preferentially the component potting area has at least one open side and in particular only one open side, wherein all other sides are closed by material of the module body.

The further electronic components may be any single electronic part, such as a single resistor, a single capacitor or a single diode, or may be any electronic circuit. In particular, the electronic component is at least one electronic component additional to the LED element. There may be several electronic components mounted in the component potting area and/or on the mounting surface. Preferably, each electronic component comprising more than one single electronic part is built as an electronic module, with the electronic parts more preferably mounted on at least one circuit board and most preferably on precisely one single circuit board. Preferentially, all electronic components are built and/or arranged in the lighting module to be driven by an unmodified driver circuit, in particular of a lighting system, within the specification and/or as originally intended for the lighting module.

The at least two lead frame elements are arranged in the carrier base module to provide an electrical connection to and/or between the electrical components of the lighting module, especially between components inside the component potting area and/or on the mounting surface. Each lead frame element might be made from any electrically conductive material. Preferably all lead frame elements are made from the same material, in particular a metal or an alloy. A lead frame element may also be part of a printed circuit board. Most preferably, both lead frame elements are arranged in parallel and/or are identical to one another. Preferentially, both lead frame elements, in particular all lead frames, are electrically isolated from one another. There may be more than two lead frame elements and in particular there may be at least one, preferably two further lead frame elements to be able to mount at least one electronic component electrically isolated from the LED element and/or another electronic component.

Each lead frame comprises at least one terminal side and/or is arranged at one terminal side for mounting the at least one LED element and/or at least one further electronic component, wherein preferably one terminal side is arranged on or next to the mounting surface for the LED element. Further, the two lead frame elements and/or at least one, preferably two further lead frame elements comprise at least two second terminal sides for electrically connecting at least one further electronic component. Each of the second terminal sides may be arranged at one of the lead frame elements and/or both second terminal sides may form two contacts to connect one or several further electronic components.

It is further preferred that at least one, more preferably all terminal sides are arranged inside and/or at a surface of the component potting area and/or the mounting surface. Each terminal side may be a flat surface to provide an electrical contact to an electronic component of the lighting module and preferably for welding, gluing or soldering an electronic component, the LED element and/or an electrical connector, in particular for ribbon bonding, to the terminal side. Accordingly, it is especially preferred that each terminal side is a bond pad. More preferably, at each terminal side means for electrically connecting at least one electronic component, most preferably by an electrical plug connection or by a plug-in board connection, are provided. At least two terminal sides of a lead frame element might be arranged directly adjacent to one another and/or might be made of one single flat surface. Accordingly, the term "terminal side" might refer to one of at least two positions on a larger surface of the lead frame element.

Mounting at least one electronic component after the mechanical assembly of the carrier base module generally means that first the assembly of the mechanical parts of the carrier base module, in particular comprising the module body and the lead frames, is finished and afterwards the electronic components are mounted in the preferably mechanically finished carrier base module. Most preferably, first all mechanical, non-electronic components of the carrier base module are assembled. Finally, the already finished carrier base module can be adapted to the customer's specifications by adding specifically chosen electronic components and/or at least one LED element to the mounting surface and/or the component potting area.

To help dissipating heat produced by the LED element and/or an electronic component, in particular mounted directly adjacent to the LED element, in preferred embodiments of the carrier base module and/or the lighting module a heat sink element is arranged on the module body, in particular in the area of the mounting surface and most preferably directly between the module body and the LED element and especially preferred, the LED element is directly mounted to the surface of the heat sink element. Preferably, the heat sink element covers at least the area of the LED element on the mounting surface of the module body and is in particular preferably at least 25%, more preferably 50% and most preferably 100% larger than the area of the LED element. Further preferentially, the heat sink element is not in contact with the lead frames and/or arranged adjacent to the lead frames. The heat sink element may be placed on or in the surface of the module body. In particular preferred, the heat sink element at least partially, preferably fully embedded in the polymer material of the module body.

The heat sink should be made out of a material with good heat conduction, preferably metal, in particular comprising aluminum and/or copper. The heat sink may be made in one piece, or may comprise several pieces joined together.

In preferred embodiments, the second terminal side of each lead frame element is and/or the second terminal sides are arranged in the component potting area directly adjacent to the first terminal side of the same lead frame element and/or to the LED element, advantageously allowing to arrange at least one electronic component to be mounted electrically connected in parallel to the LED element and/or in close proximity to the LED element. Additionally, several electronic components of a lighting module may be arranged in series and/or in parallel in the component potting area.

The LED element may be electrically connected to the first and/or second terminal side of the at least two lead frames and preferably to precisely two lead frames of the lighting module by electrical connectors, wherein each of the two electrical connectors most preferably allows a connection by wire or ribbon bonding. It is in particular preferred that the LED element and/or the at least one electronic component is electrically connected to the lead frame elements via ribbon bonding. Accordingly, it is preferred that an electrical connector is electrically connected, preferably glued, welded or soldered, to each of the two lead frames for electrically connecting the LED element and/or the electronic component to each of the lead frames. In particular preferred, two pins or other connection points of the LED element are each connected to one lead frame by one electrical connector.

The electronic component of the lighting module, which may be mounted in the component potting area and/or on the mounting surface and/or at one terminal end of the lead frames, may be any electronic part or any electronic circuit. Preferably the electronic component comprises and more preferably is a bin code resistor and/or a thermal resistor and/or a TVS diode and/or a capacitor, which is most preferably mounted between two lead frames and/or adjacent to the LED element. A bin code resistor may be used for determining the current which is used to drive the LED element. A TVS diode is a transient voltage suppression diode which may be used to protect the LED element from electronic discharge (ESD). The TVS diode is preferably mounted adjacent and/or electrically in parallel to the LED element. The TVS diode is most preferably a bidirectional TVS diode. The electronic component may also be a capacitor, which is also preferably mounted adjacent and/or electrically in parallel to the LED element and/or another electronic component. The capacitor may be arranged in parallel to the LED element and/or an electronic component on the same terminal sides or spaced apart on other terminal sides of the same lead frame elements. The thermal resistor is a thermistor and may have a negative or positive temperature coefficient. Most preferably the thermal resistor is a NTC. A thermal resistor is preferably mounted on the mounting surface of the lighting module, more preferably in close proximity to the LED element and most preferably immediately adjacent to the LED element. It is further preferred that the thermal resistor and/or the TVS diode and/or the bin code resistor are mounted to two further lead frame elements and/or are mounted electrically independent and isolated from the LED element. Generally, the further lead frame elements preferably also each have at least one terminal side, most preferably arranged directly adjacent to the LED element.

According to a further preferred embodiment, the component potting area of the lighting module has a coating, a cover and/or is enveloped in a protective material to protect the electronic components in the component potting area and/or on the mounting surface from the environment and/or from humans touching the electronic components. Most preferably the electronic components and/or the complete lighting module is sealed. Preferentially, the module body with the exception of the LED element and/or the opening for the LED element is potted. The potting of the potting area and in particular of the recess in the module body is preferably done with a polymer material, in particular a silicone material.

It may be further preferred that at least two second terminal sides are arranged in the component potting area on at least two different lead frame elements, advantageously allowing to connect at least one further electronic component, more preferably electrically independent from the LED element and/or another electronic component.

According to a preferred embodiment, the module body and/or the lighting module comprises a recess surrounding the mounting surface for the LED element. It is further preferred that at least one terminal side, preferably all terminal end sides, of each of the two lead frames is arranged in the area of the recess surrounding the mounting surface for the LED element and most preferably at least one further electronic component is mounted between the two lead frames, in particular in the recess and/or adjacent to the LED element, advantageously allowing to easily mount a further electronic component at a well accessible position of the lighting module and/or advantageously in close proximity to the LED element. The area in the recess of the module body for the LED element is preferably not fully covered by the LED element so that at least one, preferentially several further electronic components can be mounted next to the LED element.

According to one embodiment, the recess and/or the opening of the potting area is arranged within the module body on a side of the module body comprising the mounting surface and/or the LED element, advantageously allowing to mount an electronic component without influencing the LED element on the front face of the lighting module.

According to an advantageous embodiment of the method, the component potting area is potted after placement of the electronic component, in particular by potting with a silicone material. Preferentially, all electronic components in the component potting area and/or all ribbon bonds are fully potted, i.e. covered by potting material. It is particularly preferred, that also parts of the LED element are covered by potting material, wherein the light emitting area of the LED element is not potted and left free from potting material. It is additionally preferred that during the building of the module body at least one heat sink element is embedded in the module body in the area of a mounting surface. Finally, it may be advantageous that the LED element and/or the at least one electronic component is electrically connected to terminal sides of the lead frame elements via ribbon bonding.

These and other aspects of the invention will be apparent from and elucidated with reference to the embodiments described hereinafter.

BRIEF DESCRIPTION OF THE DRAWING(S)

DETAILED DESCRIPTION OF THE PREFERRED EMBODIMENT(S)

Figure 1:
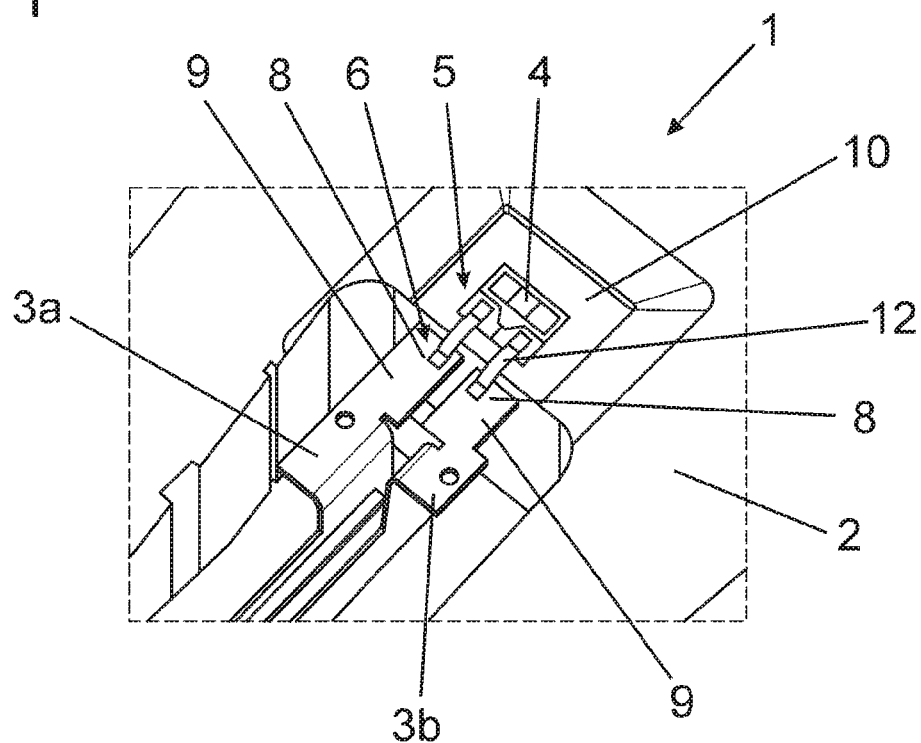
FIG. 1 shows a perspective view of a section of an embodiment of a carrier base module with parts of the outer surface removed.
Figure 2:
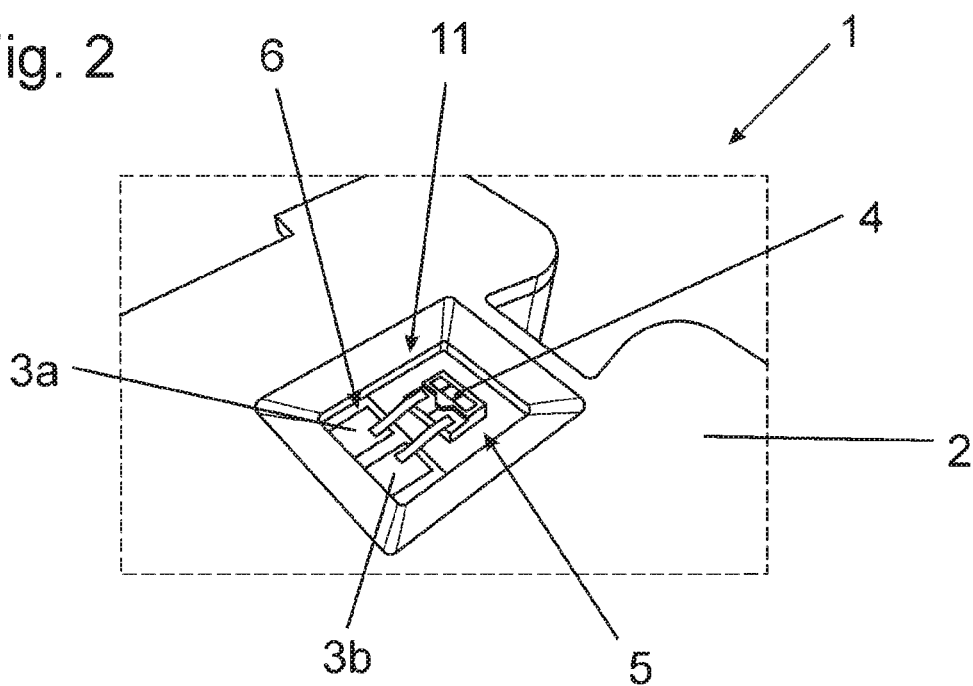
FIG. 2 shows another perspective view of the carrier base module of FIG. 1 with the closed outer surface.

An embodiment of a carrier base module 1 for a lighting module is shown in FIGS. 1 and 2. The module body 2 of the carrier base module 1 is made of a polymer material and comprises a component potting area 6 formed as a recess 11 in the module body 2. In the component potting area 6 one or several electronic components 7 such as controller circuit boards can be arranged and electrically connected to each of two lead frame elements 3a, b.

The lead frame elements 3a, b are arranged with one terminal side 9 in the component potting area 6 and with another terminal side 8 in direct proximity to a mounting surface 5 in the recess 11 of the carrier base module 1. The mounting surface 5 is a flat surface on the front face of the carrier base module 1 and accordingly of a lighting module, where an LED element 4 as well as further components 7 can be arranged.

The LED element 4 comprises three single rectangular LEDs with a flat surface connected to a single substrate which is directly mounted on the mounting surface 5 of the carrier base module 1. Below the LED element 4, a metallic heat sink element 10 is embedded in the surface of the module body 2 for conducting heat away from the LED element 4 during operation. The LED element 4 is electrically connected to the first terminal side 8 of each of the lead frames 3a, b via a metallic connector 12 for ribbon bonding.

In a completed lighting module built from the carrier base module 1 as well as at least one electronic component 7, the recess 11 comprising the component potting area 6 as well as the mounting surface 5 is closed by a layer of silicone inserted into the recess 11 on the outer surface of the module body 2 potting the component potting area 6.

To produce a lighting module, first a carrier base module 1 is build from polymer material with a component potting area 6 as well as at least two lead frame elements 3a, b embedded in the polymer material. The carrier base module 1 has at least two terminal sides 8, 9 of each of the lead frame elements 3a, b arranged on the module body 2 with at least one surface accessible for electrically connecting at least one electronic component 7. Then an LED element 4 is mounted directly on a heat sink element 10 embedded in the module body 2 in the area of a mounting surface 5 of the module body 2, wherein the LED element 4 is electrically connected to the first terminal side 8 of the at least two lead frame elements 3a, b.

Afterwards, at least one electronic component 7 is mounted to the mounting surface 5 and/or in the component potting area 6 of the standardized carrier base module 1 and electrically connected to the lead frame elements 3a, b and or further lead frame elements 3c, d for building a finished lighting module.

Figure 3:
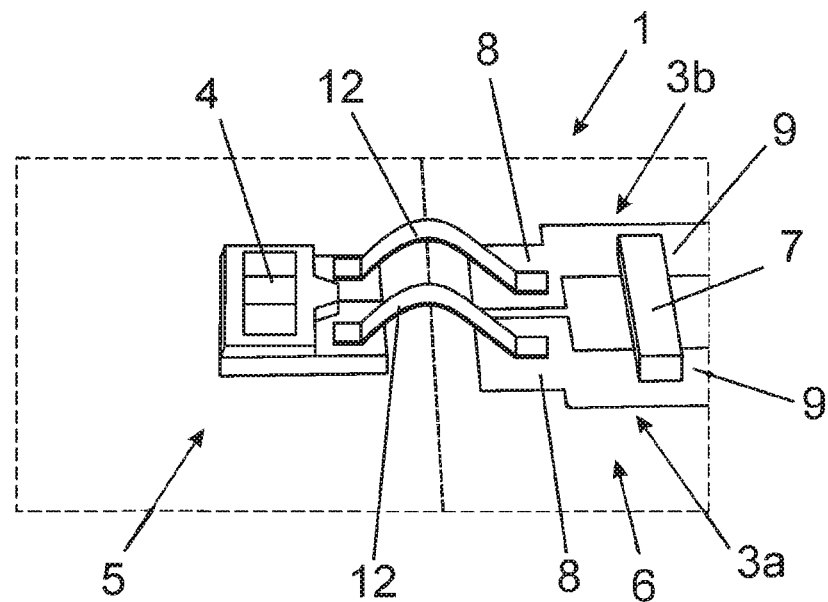
FIG. 3 shows a detailed perspective view of a mounting surface of a carrier base module with a TVS diode mounted two lead frame elements in a component potting area.
Figure 4:
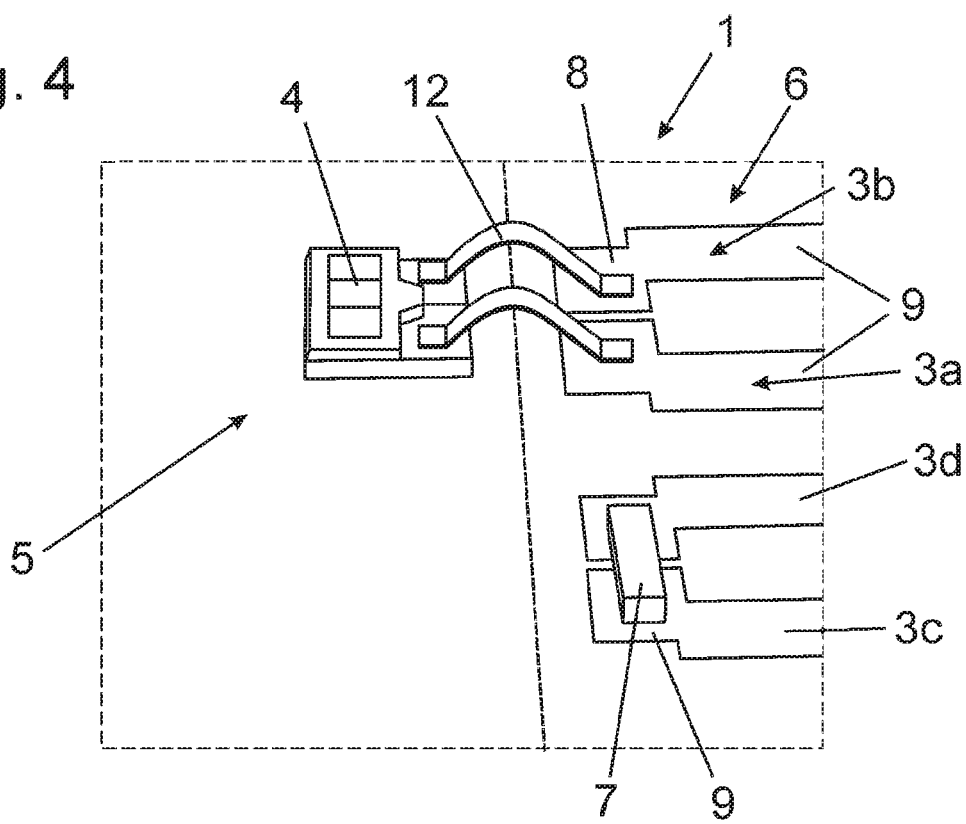
FIG. 4 shows a detailed perspective view of a mounting surface of a carrier base module with a thermistor mounted to additional lead frame elements in a component potting area.
Figure 6:
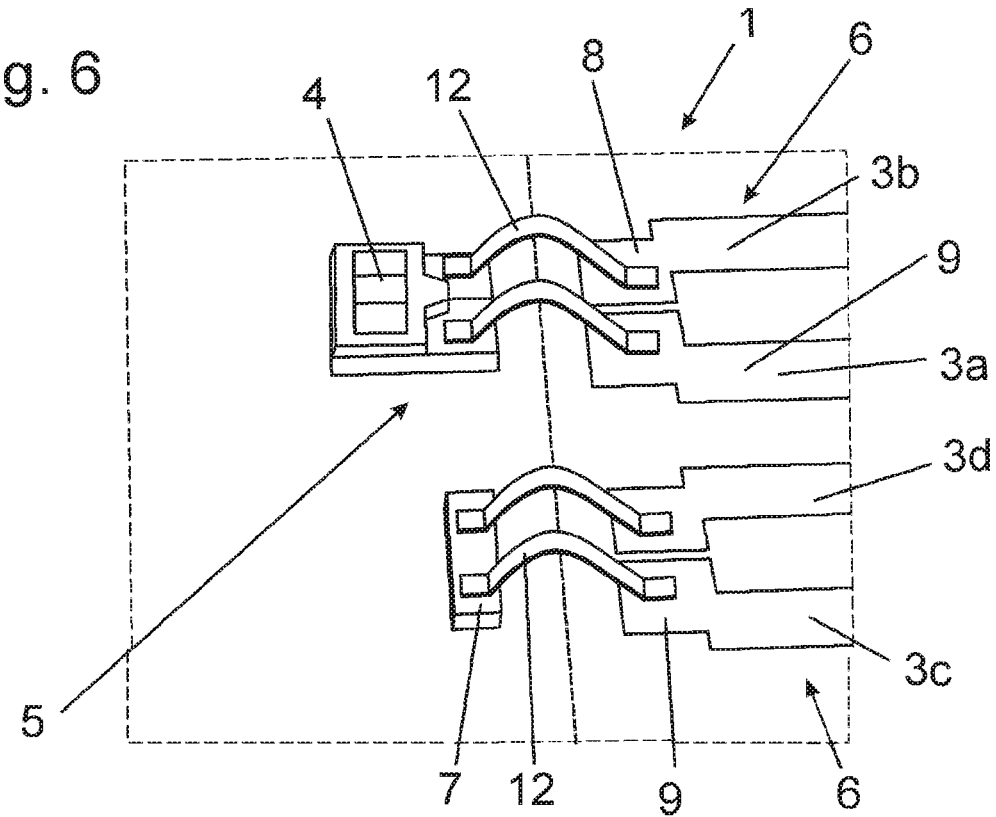
FIG. 6 shows another detailed perspective view of a mounting surface of a carrier base module with a thermistor mounted to additional lead frame elements by ribbon bonding.

An electronic component 7, such as a TVS diode, might be arranged in parallel to the LED element 4 and electrically connected to the second terminal side 9 of each of the two lead frame elements 3a, b (see FIG. 3). Alternatively or additionally, an electronic component 7, such as a thermistor or a bin code resistor, might be mounted to two additional lead frame elements 3c, d, which are not electrically connected to the first two lead frame elements 3a, b (see FIG. 4), The electronic component 7 might be directly mounted on the terminal sides 9 of the second pair of lead frame elements 3c, d (see FIG. 4) or might be mounted to the mounting surface 5 connected via ribbon bonds (see FIG. 6).

Figure 5:
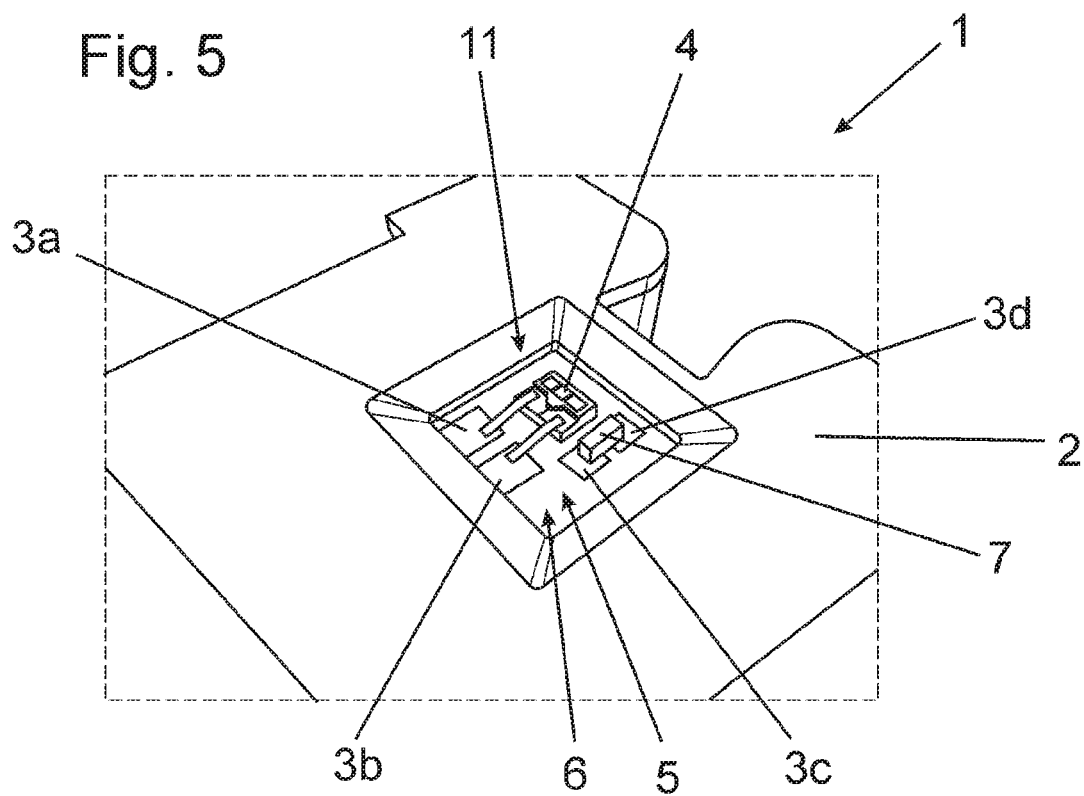
FIG. 5 shows another perspective view of a carrier base module with a bin code resistor mounted to additional lead frame elements in a component potting area.

Finally, on the mounting surface 5 and in the component potting area 6 there might be further second terminal sides 9, which might be isolated or electrically connected to the first two lead frame elements 3a, b or to further lead frame elements 3c, d (see FIG. 5).

While the invention has been illustrated and described in detail in the drawings and foregoing description, such illustration and description are to be considered illustrative or exemplary and not restrictive; the invention is not limited to the disclosed embodiments.

In particular, the LED element 4 including the number and specific shape of the LEDs should be considered exemplary; different shapes, numbers and sizes are possible. Further, in alternative embodiments the shape and size of the module body 2 may be chosen differently. Finally, also the position of the recess 11 of the component potting area 6 as well as surrounding the mounting surface 5 may be arranged at a different position on the module body 2.

These and other variations of the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

The mere fact that certain measures or features are recited in mutually different dependent claims or disclosed in separate embodiments does not indicate that a combination of these measures and features cannot be used to advantage. Any reference signs in the claims should not be construed as limiting the scope.

What is claimed is:

1. A carrier base module comprising:
a module body comprising a heat sink element partially covered in a polymer material, a portion of the heat sink element being exposed from the polymer material and forming both a component potting area and a mounting surface adjacent the component potting area;
a plurality of lead frame elements, at least two of the plurality of lead frame elements comprising a first part and a second part on the component potting area and a remainder of the at least two of the plurality of lead frame elements embedded in the polymer material of the mounting body so that at least one additional electronic component can be mounted on the second part of the at least two of the plurality of lead frame elements after mechanical assembly of the carrier base module to build a lighting module; and
an LED element on the mounting surface of the module body and electrically coupled to the first part of the at least two of the plurality of lead frame elements.

2. The carrier base module according to claim 1, wherein the heat sink element is in contact with the LED element.

3. The carrier base module according to claim 1, further comprising at least two additional lead frame elements embedded in the polymer material of the module body and not electrically coupled to the LED element.

4. The carrier base module according to claim 1, wherein at least one of the first and second parts is in the recess.

5. The carrier base module according to claim 1, further comprising at least one of an electrical connector electrically coupled between the first parts of the at least two lead frame elements and the LED element and another electrical connector electrically coupled between the second parts and at least one electronic component.

6. The carrier base module according to claim 5, wherein the at least one of the electrical connector and the other electrical connector is one of a ribbon bond and a wire bond.

7. An automotive lighting system comprising:
a carrier base module comprising:
a module body comprising a heat sink element partially covered in a polymer material, a portion of the heat sink element being exposed from the polymer material and forming both a component potting area and a mounting surface adjacent the component potting area,
plurality of lead frame elements, at least two of the plurality of lead frame elements comprising a first part and a second part on the component potting area and a remainder of the at least two of the plurality of lead frame elements embedded in the polymer material of the mounting body so that at least one additional electronic component can be mounted on the second part of the at least two of the plurality of lead frame elements after mechanical assembly of the carrier base module to build a lighting module, and
an LED element on the mounting surface of the module body and electrically coupled to the first part of the at least two of the plurality of lead frame elements; and
at least one electronic component on the second part of the at least two of the plurality of lead frame elements.

8. The system according to claim 7, further comprising at least two additional lead frame elements embedded in the polymer material of the module body, the at least one electronic component comprising one of a bin code resistor and a thermal resistor electrically coupled to the at least two additional lead frame elements.

9. The system according to claim 7, wherein the at least one electronic component is a TVS diode electrically coupled in parallel with the LED element.

10. The system according to claim 9, wherein the TVS diode is on the second part of the at least two lead frame elements.

11. The system according to claim 7, further comprising a potting material covering at least the component potting area.

12. The system according to claim 11, further comprising at least one of an electrical connector electrically coupled between the first parts of the at least two lead frame elements and the LED element and another electrical connector electrically coupled between the second parts and at least one electronic component, the component potting material covering the at least one electronic component, the at least one electrical connector, and the at least one other electrical connector without covering at least a top surface of the LED element.

13. The system according to claim 12, wherein the at least one of the electrical connector and the other electrical connector is one of a ribbon bond and a wire bond.

14. The system according to claim 11, wherein the component potting material is in a recess in the polymer material.

15. The system according to claim 7, wherein the at least one electronic component is another LED element.

16. The system according to claim 7, further comprising at least one capacitor in parallel at least one of the at least one electronic component and the LED element.

17. A method for producing a customizable lighting module, the method comprising:

building a module body by at least covering a heat sink element with a polymer material such that a portion of the heat sink element is exposed from the polymer material to form both a component potting area and a mounting surface adjacent the potting area;

partially embedding at least two lead frame elements in the polymer material such that a first part and a second part of the at least two lead frame elements are on the component potting area and a remainder of the at least two of the plurality of lead frame elements is embedded in the polymer material;

mounting an LED element on the mounting surface to electrically couple the LED element to the first part of the at least two lead frame elements; and mounting at least one electronic component on the second part of the at least two lead frame elements after the LED element is mounted.

18. The method according to claim 17, further comprising potting the component potting area using a potting material after the mounting of the electronic components.

* * * * *